(12) United States Patent
Lee et al.

(10) Patent No.: US 12,085,843 B2
(45) Date of Patent: *Sep. 10, 2024

(54) METHOD OF MANUFACTURING EUV PHOTO MASKS

(71) Applicant: TAIWAN SEMICONDUCTOR MANUFACTURING COMPANY, LTD., Hsinchu (TW)

(72) Inventors: Hsin-Chang Lee, Hsinchu (TW); Pei-Cheng Hsu, Hsinchu (TW); Ta-Cheng Lien, Hsinchu (TW); Tzu Yi Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/226,151

(22) Filed: Jul. 25, 2023

(65) Prior Publication Data

US 2023/0367193 A1    Nov. 16, 2023

Related U.S. Application Data

(63) Continuation of application No. 17/461,520, filed on Aug. 30, 2021, now Pat. No. 11,789,356, which is a
(Continued)

(51) Int. Cl.
*G03F 1/22* (2012.01)
*G03F 1/80* (2012.01)
*H01J 37/32* (2006.01)

(52) U.S. Cl.
CPC ............... *G03F 1/22* (2013.01); *G03F 1/80* (2013.01); *H01J 37/32009* (2013.01); *H01J 2237/334* (2013.01)

(58) Field of Classification Search
CPC ..... G03F 1/22; G03F 1/80; G03F 1/38; G03F 1/40; G03F 1/24; G03F 1/54;
(Continued)

(56) References Cited

U.S. PATENT DOCUMENTS 8,796,666 B1    8/2014    Huang et al.
9,093,530 B2    7/2015    Huang et al.
(Continued)

FOREIGN PATENT DOCUMENTS

CN    106601602 A    4/2017
CN    108010966 A    5/2018
(Continued)

OTHER PUBLICATIONS

Notice of Allowance issued in U.S. Appl. No. 17/461,520, dated Jun. 6, 2023.
(Continued)

*Primary Examiner* — Caleen O Sullivan
(74) *Attorney, Agent, or Firm* — STUDEBAKER & BRACKETT PC

(57) ABSTRACT

In a method of manufacturing a photo mask, an etching mask layer having circuit patterns is formed over a target layer of the photo mask to be etched. The photo mask includes a backside conductive layer. The target layer is etched by plasma etching, while preventing active species of plasma from attacking the backside conductive layer.

20 Claims, 16 Drawing Sheets

Related U.S. Application Data continuation of application No. 16/383,535, filed on Apr. 12, 2019, now Pat. No. 11,106,126.

(60) Provisional application No. 62/738,709, filed on Sep. 28, 2018.

(58) Field of Classification Search
CPC .. G03F 7/2004; G03F 7/2063; G03F 7/70033; G03F 7/70691; H01J 37/32009; H01J 2237/334; H01L 21/3065; H01L 21/67069
USPC ............................................................. 430/5
See application file for complete search history.

(56) References Cited

U.S. PATENT DOCUMENTS

| | | | |
|---|---|---|---|
| 9,184,054 | B1 | 11/2015 | Huang et al. |
| 9,256,123 | B2 | 2/2016 | Shih et al. |
| 9,529,268 | B2 | 12/2016 | Chang et al. |
| 9,548,303 | B2 | 1/2017 | Lee et al. |
| 9,618,837 | B2 | 4/2017 | Lu et al. |
| 9,869,928 | B2 | 1/2018 | Huang et al. |
| 9,869,934 | B2 | 1/2018 | Huang et al. |
| 9,869,939 | B2 | 1/2018 | Yu et al. |
| 11,106,126 | B2 | 8/2021 | Lee et al. |
| 11,789,356 | B2 * | 10/2023 | Lee ..................... G03F 1/40 430/5 |
| 2008/0268352 | A1 | 10/2008 | Takai |
| 2010/0167186 | A1 | 7/2010 | Jang et al. |
| 2014/0154615 | A1 | 6/2014 | Yu et al. |
| 2015/0072528 | A1 | 3/2015 | Tung et al. |
| 2016/0377972 | A1 | 12/2016 | Hofmann et al. |
| 2017/0131627 | A1 | 5/2017 | Hassan et al. |
| 2017/0329215 | A1 | 11/2017 | Hamamoto et al. |
| 2018/0180987 | A1 | 6/2018 | Matsumoto et al. |
| 2019/0146325 | A1 | 5/2019 | Hsueh et al. |
| 2019/0146326 | A1 | 5/2019 | Tien et al. |

FOREIGN PATENT DOCUMENTS

| | | |
|---|---|---|
| DE | 10 2007 028 800 A1 | 12/2008 |
| JP | 2010141338 A | 6/2010 |
| JP | 2015-138914 A | 7/2015 |
| KR | 10-2005-0118267 A | 12/2005 |
| KR | 10-2006-0086865 A | 8/2006 |
| KR | 10-2010-0101003 A | 9/2010 |
| TW | 200908093 A | 2/2009 |
| TW | 201133966 A | 10/2011 |
| TW | 201642311 A | 12/2016 |
| WO | 2008/056614 A1 | 5/2008 |
| WO | 2018/091601 A1 | 5/2018 |

OTHER PUBLICATIONS

Non-Final Office Action issued in U.S. Appl. No. 17/461,520, dated Feb. 22, 2023.
Non-Final Office Action issued in U.S. Appl. No. 16/383,535, dated Dec. 30, 2020.
Notice of Allowance issued in U.S. Appl. No. 16/383,535, dated Apr. 16, 2021.
Notice of Allowance issued in corresponding Korean Patent Application No. 10-2019-0082638, dated Nov. 22, 2021.

* cited by examiner

METHOD OF MANUFACTURING EUV PHOTO MASKS

CROSS-REFERENCE TO RELATED APPLICATIONS

This application is a continuation of U.S. patent application Ser. No. 17/461,520 filed Aug. 30, 2021, which is a continuation of U.S. patent application Ser. No. 16/383,535 filed Apr. 12, 2019, now U.S. Pat. No. 11,106,126, which claims priority to U.S. Provisional Patent Application 62/738,709, filed Sep. 28, 2018, the entire disclosure of each of which is incorporated herein by reference.

BACKGROUND

Photolithography operations are one of the key operations in the semiconductor manufacturing process. Photolithography techniques include ultraviolet lithography, deep ultraviolet lithography, and extreme ultraviolet lithography (EUVL). The photomask is an important component in photolithography operations. It is critical to fabricate EUV photomasks free of defects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1B:
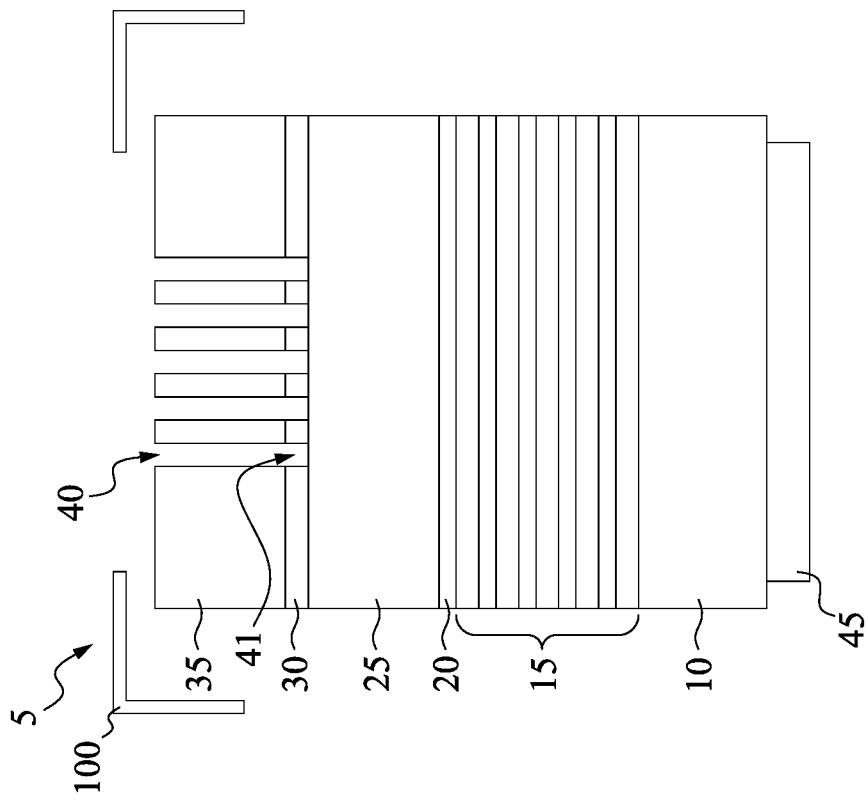
FIGS. 1A, 1B, 1C, 1D, 1E, 1F and 1G schematically illustrate a method of fabricating an EUV photomask according to an embodiment of the disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Embodiments of the present disclosure provide a method of manufacturing an EUV photo mask. More specific, the present disclosure provides techniques to prevent or suppress damage on backside conductive layer of an EUV photo mask.

EUV lithography (EUVL) employs scanners using light in the extreme ultraviolet (EUV) region, having a wavelength of about 1 nm to about 100 nm, for example, 13.5 nm. The mask is a critical component of an EUVL system. Because the optical materials are not transparent to EUV radiation, EUV photo masks are reflective masks. EUV photo masks require very low surface roughness and must have no resolvable defects.

An EUV photo mask with circuit patterns for EUV lithography requires various etching operations, such as plasma dry etching. An EUV photo mask to be etched is placed on a mask stage in a plasma etching chamber. In some embodiments, the mask stage includes an electric chuck mechanism to hold the EUV photo mask during the plasma etching. In other embodiments, the EUV photo mask is merely placed on the cathode of the mask stage. An EUV photo mask includes a backside conductive layer to the electric chuck mechanism. However, when a large gap exists between the EUV photo mask and the stage, active species of the plasma may diffuse to the bottom portion of the EUV photo mask, causing damage on the backside conductive layer of the EUV photo mask. Damage on the backside conductive layer may causes various problems, such as generation of particles and/or tree-like erosion at the edge of the conductive film. These particles and/or defects in the backside conductive layer may cause insufficient chucking and/or defects on the circuit patterns on the front side of the EUV photo mask.

The present disclosure provides techniques to prevent the active species of the plasma from entering the side portions and the bottom portion of the EUV mask during plasma etching, thereby suppressing damage on the backside conductive layer of an EUV photo mask caused by active species.

FIGS. 1A-1G schematically illustrate a method of fabricating an EUV photomask 5 for use in extreme ultraviolet lithography (EUVL). It is understood that additional operations can be provided before, during, and after processes shown by FIGS. 1A-1G, and some of the operations described below can be replaced or eliminated, for additional embodiments of the method. The order of the operations/processes may be interchangeable.

In some embodiments, the EUV photomask with circuit patterns is formed from a EUV photo mask blank 5. The EUV photo mask blank 5 includes a substrate 10, a multilayer Mo/Si stack 15 of multiple alternating layers of silicon and molybdenum, a capping layer 20, an absorber layer 25 and a hard mask layer 30. Further, a backside conductive layer 45 is formed on the backside of the substrate 10, as shown in FIG. 1A.

The substrate 10 is formed of a low thermal expansion material in some embodiments. In some embodiments, the substrate is a low thermal expansion glass or quartz, such as fused silica or fused quartz. In some embodiments, the low thermal expansion glass substrate transmits light at visible wavelengths, a portion of the infrared wavelengths near the visible spectrum (near-infrared), and a portion of the ultraviolet wavelengths. In some embodiments, the low thermal expansion glass substrate absorbs extreme ultraviolet wavelengths and deep ultraviolet wavelengths near the extreme ultraviolet. In some embodiments, the size of the substrate 10 is 152 mm×152 mm having a thickness about 20 mm.

In some embodiments, the Mo/Si multilayer stack 15 includes from about 30 alternating layers each of silicon and molybdenum to about 60 alternating layers each of silicon and molybdenum. In certain embodiments, from about 40 to about 50 alternating layers each of silicon and molybdenum are formed. In some embodiments, the silicon and molybdenum layers are formed by chemical vapor deposition (CVD), plasma-enhanced CVD (PECVD), atomic layer deposition (ALD), physical vapor deposition (PVD) (sputtering), or any other suitable film forming method. Each layer of silicon and molybdenum is about 2 nm to about 10 nm thick in some embodiments. In some embodiments, the layers of silicon and molybdenum are about the same thickness. In other embodiments, the layers of silicon and molybdenum are different thicknesses. In some embodiments, the thickness of each layer of silicon and molybdenum is about 3 nm to about 4 nm.

The capping layer 20 is disposed over the Mo/Si multilayer 15. In some embodiments, the capping layer 20 is made of ruthenium having a thickness of from about 2 nm to about 10 nm. In certain embodiments, the thickness of the capping layer 20 is from about 2 nm to about 4 nm. In some embodiments, the capping layer 20 is formed by chemical vapor deposition, plasma-enhanced chemical vapor deposition, atomic layer deposition, physical vapor deposition, or any other suitable film forming method.

The absorber layer 25 is disposed over the capping layer 20. In some embodiments, the absorber layer 25 is Ta-based material. In some embodiments, the absorber layer 25 is made of TaN and/or TaBN, having a thickness from about 25 nm to about 100 nm. In certain embodiments, the absorber layer 25 thickness ranges from about 50 nm to about 75 nm. In some embodiments, the absorber layer 25 is formed by chemical vapor deposition, plasma-enhanced chemical vapor deposition, atomic layer deposition, physical vapor deposition, or any other suitable film forming method.

In some embodiments, an antireflective layer (not shown) is optionally disposed over the absorber layer 25. The antireflective layer is made of a silicon oxide, TaBO, TaO and/or TaON in some embodiments, and has a thickness of from about 2 nm to about 20 nm. In some embodiments, the thickness of the antireflective layer is from about 3 nm to about 6 nm. In some embodiments, the antireflective layer is formed by chemical vapor deposition, plasma-enhanced chemical vapor deposition, atomic layer deposition, physical vapor deposition, or any other suitable film forming method.

The hard mask layer 30 is disposed over the absorbing layer 25 in some embodiments. The hard mask layer 30 is formed over the antireflective layer in some embodiments where the antireflective layer exists. In some embodiments, the hard mask layer 30 is made of silicon, a silicon-based compound, chromium, a chromium-based compound and/or ruthenium having a thickness of about 4 nm to about 20 nm. In some embodiments, the chromium-based compound includes CrON, chromium oxide and/or chromium nitride. In some embodiments, the hard mask layer 30 is formed by chemical vapor deposition, plasma-enhanced chemical vapor deposition, atomic layer deposition, physical vapor deposition, or any other suitable film forming method.

The backside conductive layer 45 is disposed on a second main surface of the substrate 10 opposing a first main surface of the substrate 10 on which the Mo/Si multilayer 15 is formed. In some embodiments, the backside conductive layer 45 is made of chromium, chromium oxide, chromium oxynitride, chromium nitride, TaB or other Ta based conductive material.

A thickness of the backside conductive layer 45 is in a range from about 10 nm to about 400 nm in some embodiments. In other embodiments, the backside conductive layer 45 has a thickness of about 20 nm to about 100 nm. In certain embodiments, the thickness is in a range from about 65 nm to about 75 nm.

In some embodiments, the backside conductive layer 45 is formed by atmospheric chemical vapor deposition (CVD), low pressure CVD, plasma-enhanced CVD, laser-enhanced CVD, atomic layer deposition (ALD), molecular beam epitaxy (MBE), physical vapor deposition including thermal deposition, pulsed laser deposition, electron-beam evaporation, ion beam assisted evaporation and sputtering), or any other suitable film forming method.

In some embodiments, the area of the backside conductive layer 45 is smaller than the area of the substrate, and a circumference portion of the second main surface of the substrate 10 is exposed (not covered by the backside conductive layer 45) as shown in FIG. 1A. When the substrate 10 is a 6-inch substrate, i.e., 152 mm×152 mm, the size of the backside conductive layer 45 is greater than 142 mm×142 mm and smaller than 150 mm×150 mm in some embodiments. In other embodiments, the size of the backside conductive layer 45 is greater than 144 mm×144 mm and smaller than 148 mm×148 mm.

In the fabrication of an EUV photo mask 5, a first photoresist layer 35 is formed over the hard mask layer 30 of the EUV photo mask blank, and the photoresist layer 35 is selectively exposed to actinic radiation. Before the first photoresist layer 35 is formed, the EUV photo mask blank is subject to inspection. The selectively exposed first photoresist layer 35 is developed to form a pattern 40 in the first photoresist layer 35. In some embodiments, the actinic radiation is an electron beam or an ion beam. In some embodiments, the pattern 40 corresponds to a pattern of semiconductor device features for which the EUV photo mask 5 will be used to form in subsequent operations.

Figure 1A:
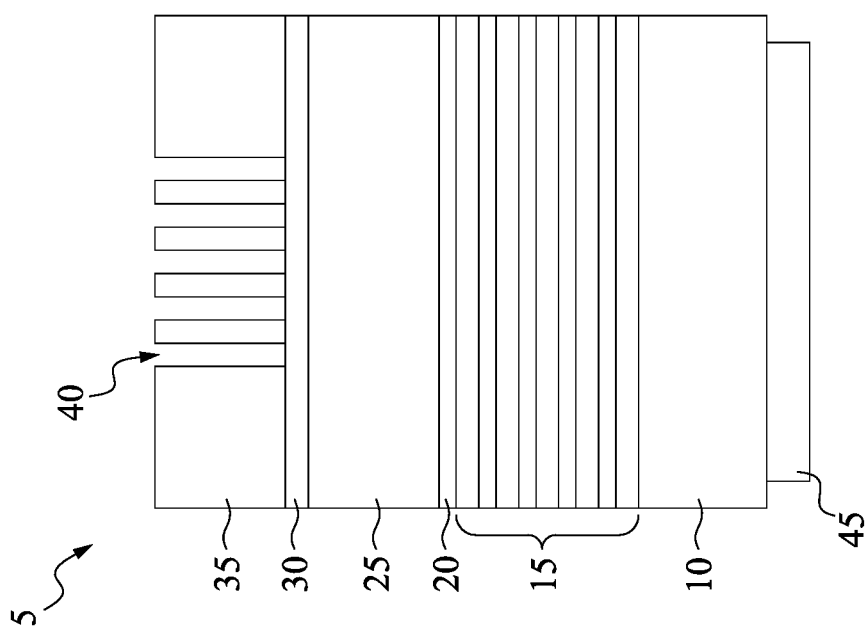

Next, the pattern 40 in the first photoresist layer 35 is extended into the hard mask layer 30 forming a pattern 41 in the hard mask layer 30 exposing portions of the absorber layer 25, as shown in FIG. 1B. The pattern 41 extended into the hard mask layer 30 is formed by etching, in some embodiments, using a suitable wet or dry etchant that is selective to the hard mask layer 30. After the pattern 41 by the hard mask layer 30 is formed, the first photoresist layer 35 is removed by photoresist stripper to expose the upper surface of the hard mask layer 30, as shown in FIG. 1C.

Figure 1D:
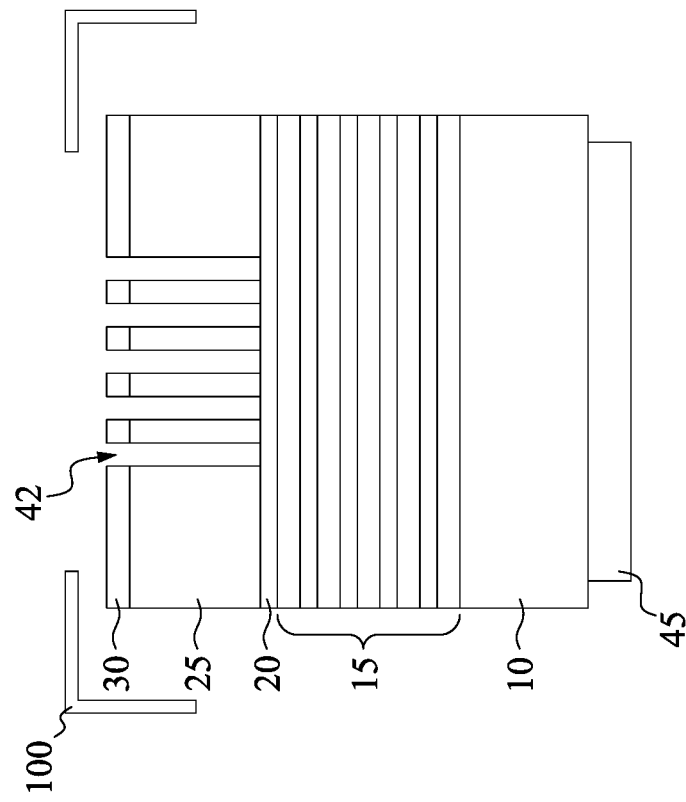
Figure 1C:
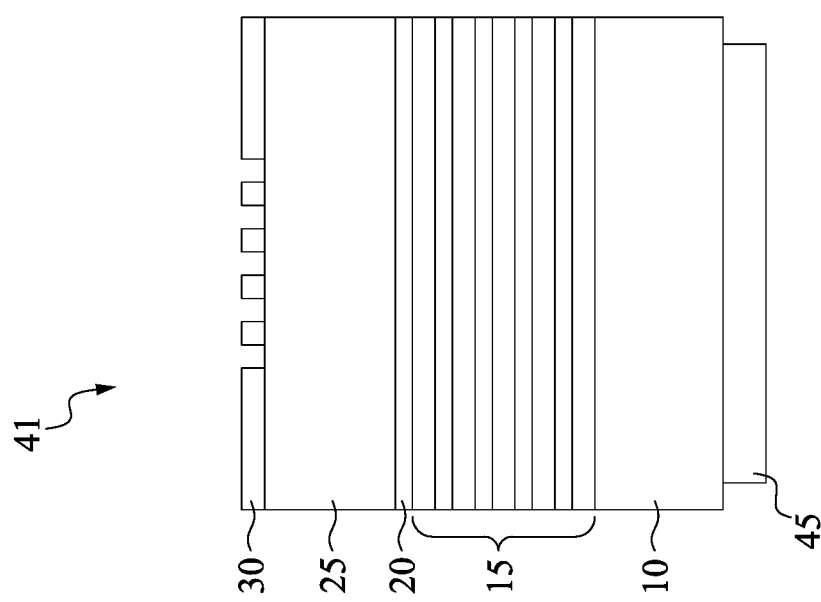

Then, the pattern 41 in the hard mask layer 30 is extended into the absorber layer 25 forming a pattern 42 in the absorber layer 25 exposing portions of the capping layer 20, as shown in FIG. 1D. The pattern 42 extended into the absorber layer 25 is formed by etching, in some embodiments, using a suitable wet or dry etchant that is selective to the absorber layer 25. In some embodiments, plasma dry etching is used.

Figure 1F:
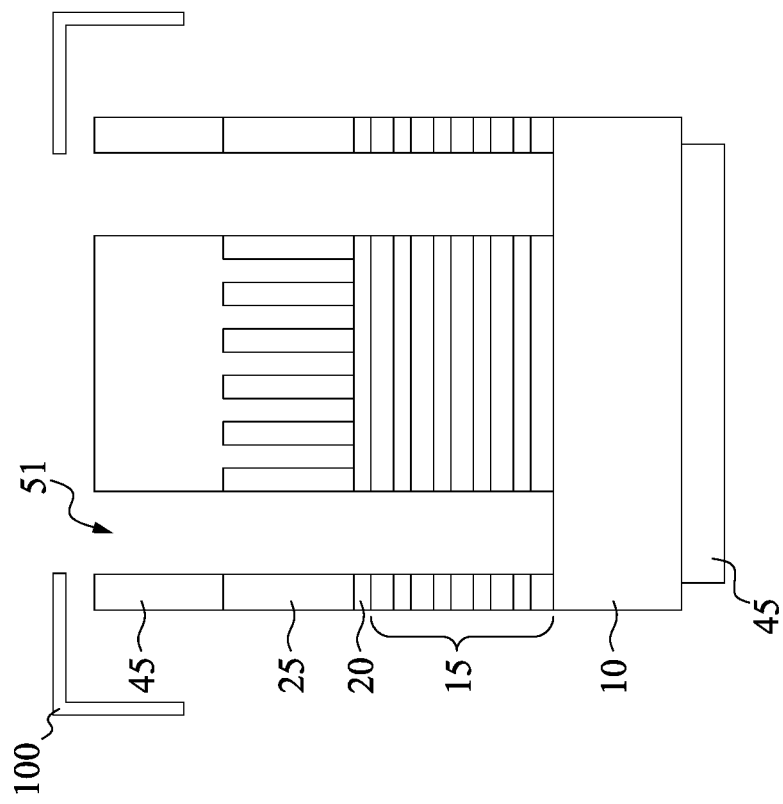
Figure 1E:
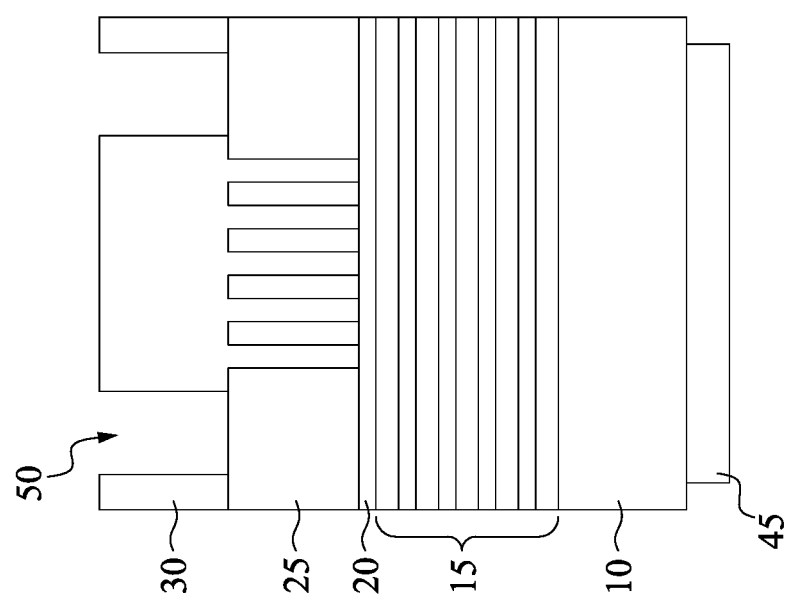

As shown in FIG. 1E, a second photoresist layer 45 is formed over the absorber layer 25 and filling the pattern 42 in the absorber layer 25. The second photoresist layer 45 is selectively exposed to actinic radiation such as electron beam, UV radiation and/or laser beam. The selectively exposed second photoresist layer 45 is developed to form a pattern 50 in the second photoresist layer 45. The pattern 50 corresponds to a black border surrounding the circuit patterns.

Next, the pattern 50 in the second photoresist layer 45 is extended into the absorber layer 25, capping layer 20, and Mo/Si multilayer 15 forming a pattern 51 in the absorber layer 25, capping layer 20, and Mo/Si multilayer 15 exposing portions of the substrate 10, as shown in FIG. 1F. The pattern 51 is formed by etching, in some embodiments, using one or more suitable wet or dry etchants that are selective to each of the layers that are etched. In some embodiments, plasma dry etching is used.

Figure 1G:
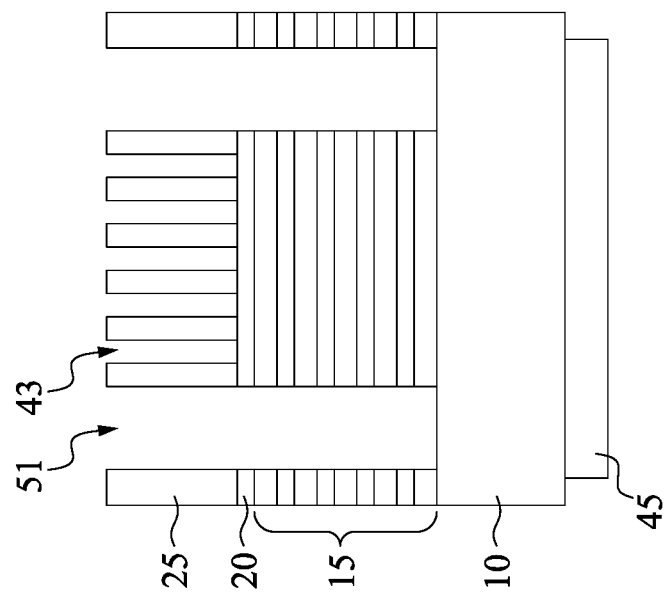

Then, the second photoresist layer 45 is removed by a suitable photoresist stripper to expose the upper surface of the absorber layer 25. The pattern 51 in the absorber layer 25, capping layer 20, and the Mo/Si multilayer 15 defines a black border of the photomask 5 in some embodiments of the disclosure, as shown in FIG. 1G. After removal of the second photoresist layer, the photomask 5 undergoes a cleaning operation, inspection, and the photomask 5 is repaired as necessary, to provide a finished photomask 5.

In the present embodiments, in at least one of the plasma dry etching operations as set forth above, an etching hard cover 100 is used to prevent the active species of the plasma from entering the side portions and the bottom portion of the EUV photo mask 5 during plasma etching.

Figure 2:
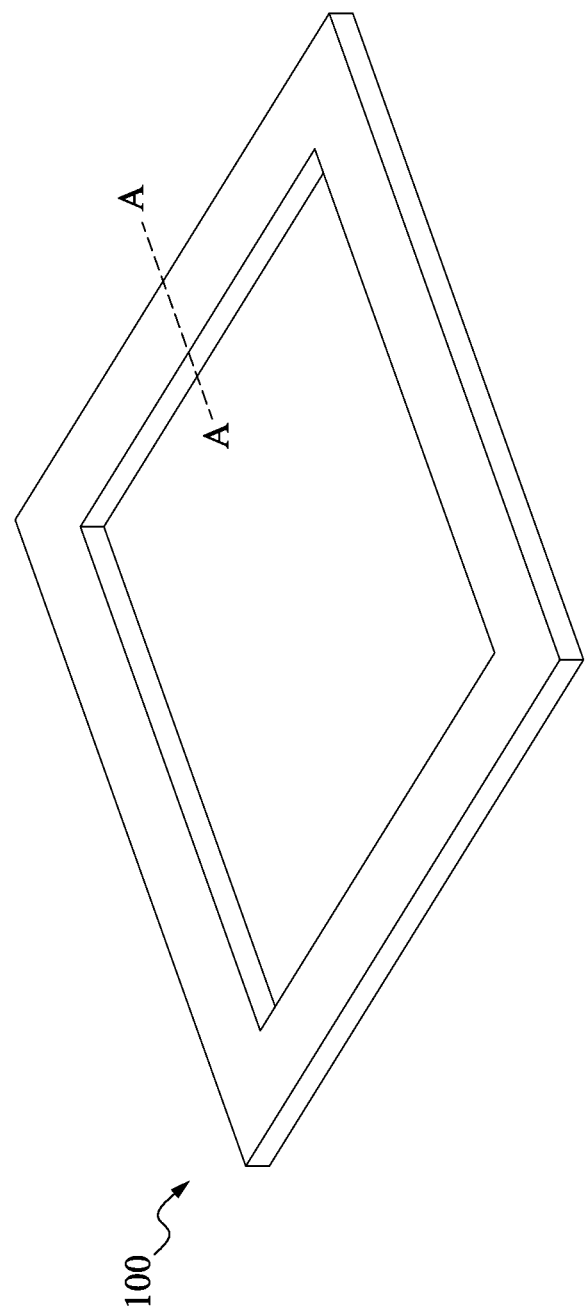
FIG. 2 shows a schematic view of a hard etching cover according to an embodiment of the present disclosure.

FIG. 2 is a perspective view of the etching hard cover 100. As shown in FIG. 2, the etching hard cover 100 has a square or a rectangular frame shape having an opening corresponding to the pattern region of an EUV photo mask 5. The etching hard cover 100 is made of a material that can endure the plasma etching of the hard mask layer (Cr contacting layer) 30. In some embodiments, the etching hard cover is made of ceramic. Ceramic material includes, for example, but not limited to, boron nitride (BN), alumina ($Al_2O_3$), silicon nitride ($Si_3N_4$), silicon carbide (SiC), zirconia ($ZrO_2$), $SiO_2$, barium titanate ($BaTiO_3$), $Y_2O_3$, $PbTiO_3$, $PbZrO_3$, $Y_3Al_5O_{12}$, YAS ($Y_2O_3$—$Al_2O_3$—$SiO_2$), $YF_3$, and $Y_2O_3$—$ZrO_2$—$Al_2O_3$. In some embodiments, the etching hard cover 100 is made of a bulk ceramic material, or a ceramic coated on metal or other material. The ceramic material may be a sintered body. In other embodiments, glass or metallic material coated with a ceramic material can be used for the etching hard cover 100. In some embodiments, the surface of the etching hard cover 100 is coated with a coating material such as a silicon oxide, silicon nitride or any other material durable to the etching gas for the light blocking layer 20. The etching hard cover 100 is attachable to and detachable from the EUV photo mask 5 to be processed and is reusable.

Figure 3:
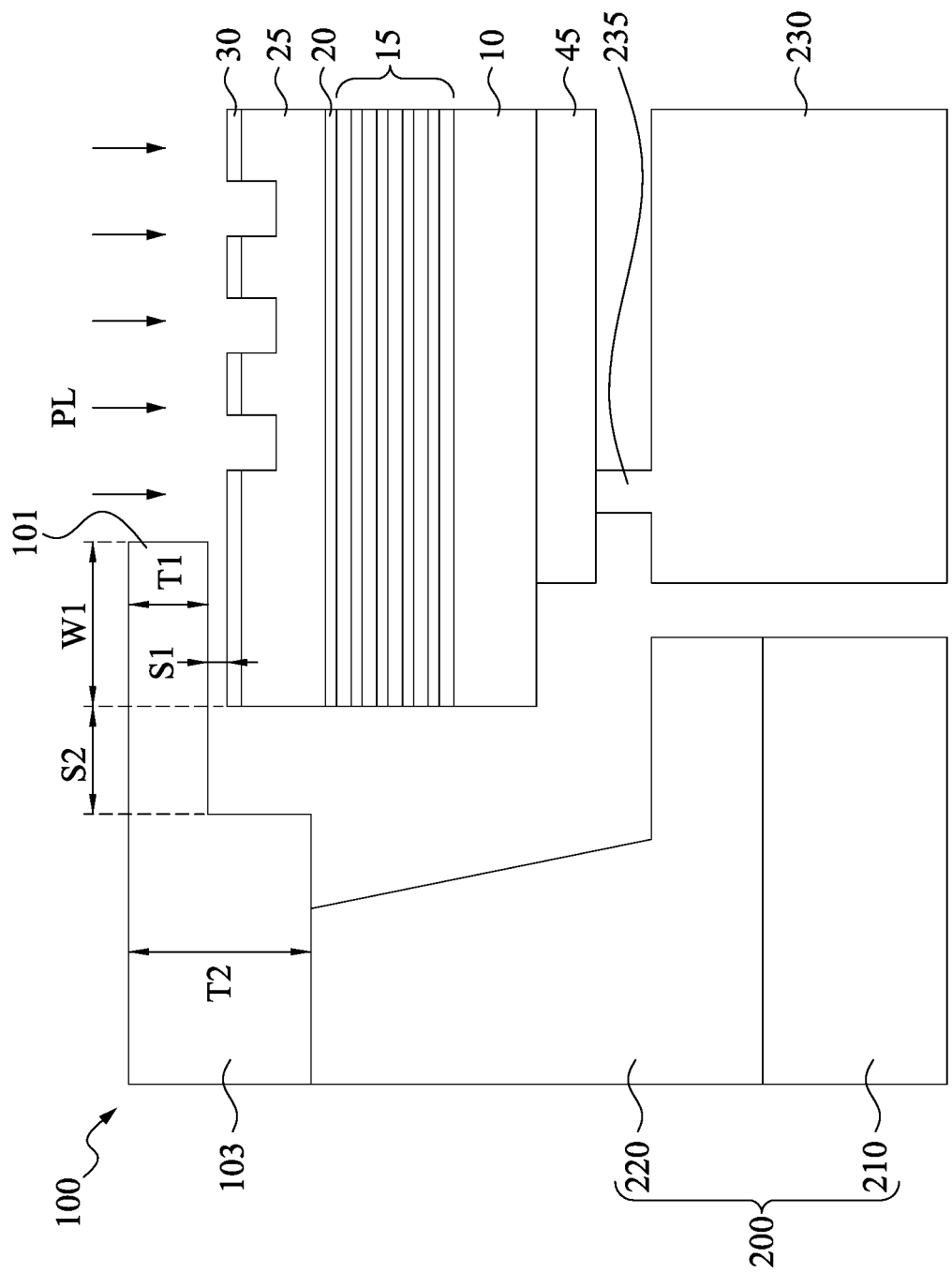
FIG. 3 shows a schematic view of an etching operation using a hard etching cover according to one embodiment of the present disclosure.

FIG. 3 shows a schematic view of an etching operation using a hard etching cover according to one embodiment of the present disclosure. FIG. 3 shows the absorber etching operation using the hard mask layer 30 as an etching mask, corresponding to FIG. 1D.

As shown in FIG. 3, a plasma etching apparatus includes a stage 200 having a capture ring 220 supported by a pedestal 210 and an electric chucking mechanism having a cathode 230 and burls (protrusions) 235 disposed thereon. The etching hard cover 100 is supported by the capture ring 220 of the stage 200 in some embodiments. Further the EUV photo mask 5 is supported by the burls (protrusions) 235 of the cathode 230 of the electric chuck mechanism in some embodiments. The stage, the pedestal and the electric chuck mechanism are disposed inside a plasma etching chamber. The etching hard cover 100 is supported by the capture ring 220 such that a main cover portion 101 of the etching hard cover 100 covers an edge portion of the surface of the hard mask layer 30 (the edge portion of the EUV photo mask 5). In some embodiments, the main cover portion 101 (a frame portion) of the etching hard cover 100 has a thickness T1 in a range from about 0.3 mm to about 0.8 mm. A side frame 103 (thick portion) of the etching hard cover 100, which is supported by the capture ring 220 of the stage 200, may have a thickness T2 in a range from about 0.6 mm to about 1.6 mm in some embodiments.

The space Si between the lower surface of the main cover portion 101 of the etching hard cover 100 and the upper surface of the hard mask layer 30 when the etching hard cover 100 is placed on the capture ring 220 is in a range from about 0 mm (touching) to about 1.0 mm in some embodiments. As shown in FIG. 3, the main cover portion 101 overlaps the EUV photo mask 5. When a distance between the edge of the EUV photo mask 5 to the edge of the main cover portion 101 is W1 (cover amount), the cover amount W1 is in a range from about 5 mm to about 10 mm. In some embodiments, the cover amount W1 is determined such that the main cover portion 101 does not overlap the region where a back border 51 is formed. Further, in some embodiments, there is a gap or a space between the side face of the EUV photo mask 5 and the side frame 103 of the etching hard cover 100. The amount S2 of the gap is in a range from about 1 mm to about 3 mm in some embodiments.

By using the etching hard cover 100, it is possible to prevent active species of plasma PL from entering the side portions and the back portion of the EUV photo mask during the plasma etching. Thus, it is possible to prevent damage on the backside conductive layer 45.

Figure 4A:
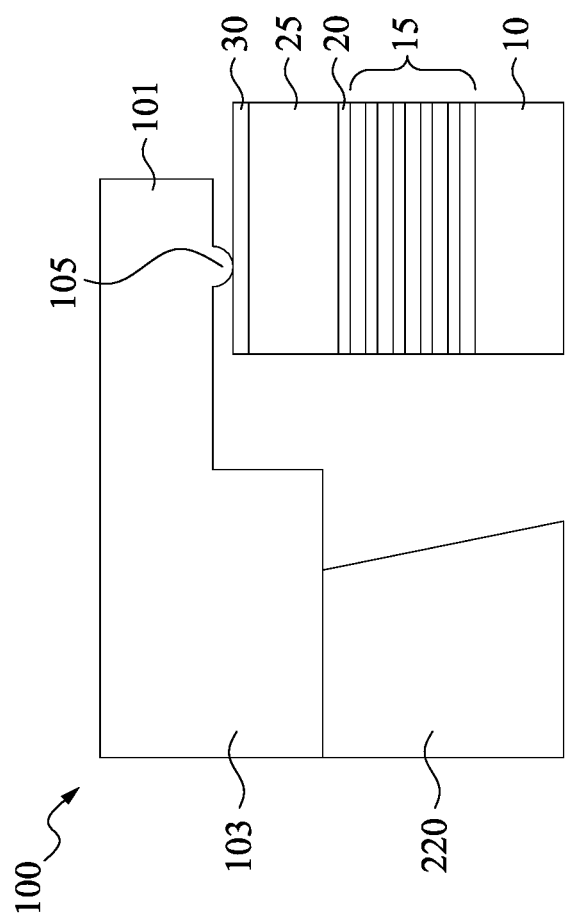
FIGS. 4A, 4B, 4C and 4D show schematic views of hard etching covers according to embodiments of the present disclosure.

FIG. 4A shows a cross section shape of the etching hard cover 100 according to another embodiment of the present disclosure. In this embodiment, the lower surface of the main cover portion 101 of the etching hard cover 100 includes an abutting portion, for example, a protrusion 105 that contacts the upper surface of the EUV photo mask 5. The protrusion 105 is a line shape pattern and formed along the entire circumference of the etching hard cover 100 in some embodiments. In other embodiments, multiple protrusions 105 are discretely provided along the circumference of the etching hard cover 100. A protruding amount of the protrusion 105 is in a range from about 0.1 mm to about 1.0 mm in some embodiments. When the protrusion 105 is used, it is possible to minimize the contact area of the etching hard cover 100 to the surface of the EUV photo mask 5 when the etching hard cover 100 is in contact with the EUV photo mask 5. In other embodiments, there is a gap between the protrusion 105 and the upper surface of the EUV photo mask 5. In certain embodiments, the gap is in a range from about 0 mm to about 0.1 mm.

Figure 4B:
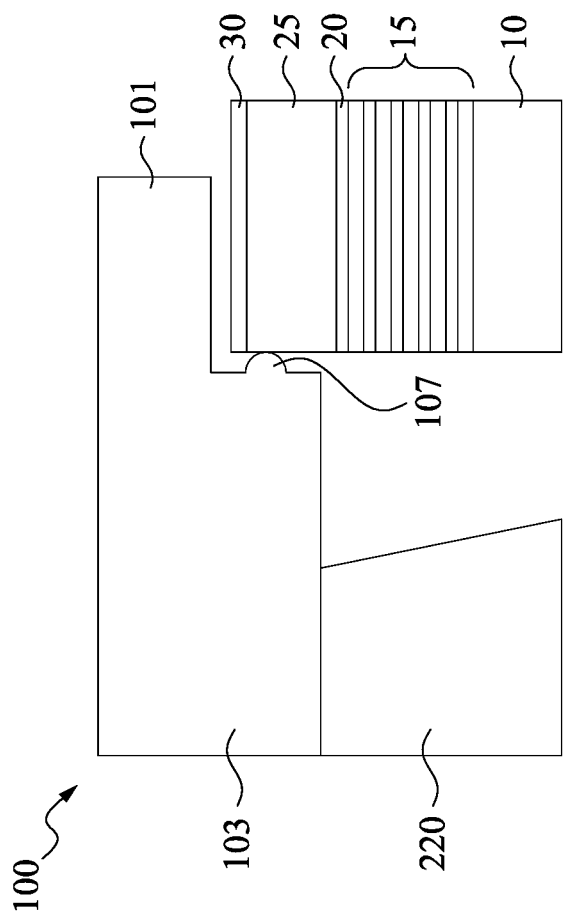

FIG. 4B shows a cross section shape of the etching hard cover 100 according to another embodiment of the present disclosure. In this embodiment, a protrusion 107 similar to the protrusion 105 of FIG. 4A is formed at the inside surface of the side frame 103, as shown in FIG. 4B. The protrusion 107 is to be in contact with the side face of the EUV photo mask 5. In some embodiments, the protrusion 107 is in contact with the side surface of the absorber layer 25. In other embodiments, the protrusion 107 is in contact with the side surface of one of the capping layer 20, the multilayer Mo/Si stack 15 and the substrate 10. The protrusion 107 is a line shape pattern and formed along the entire circumference of the etching hard cover 100 in some embodiments. In other embodiments, multiple protrusions 107 are discretely provided along the circumference of the etching hard cover 100. A protruding amount of the protrusion 107 is in a range from about 0.1 mm to about 1.0 mm in some embodiments. In some embodiments, the protrusion 107 is in contact with the side face of the EUV photo mask 5 and in other embodiments, there is a gap between the protrusion 107 and the upper surface of the EUV photo mask 5. In certain embodiments, the gap is in a range from about 0 mm to about 0.1 mm.

In some embodiments, both the protrusion 105 and the protrusion 107 are provided to the etching hard cover 100.

Figure 4C:
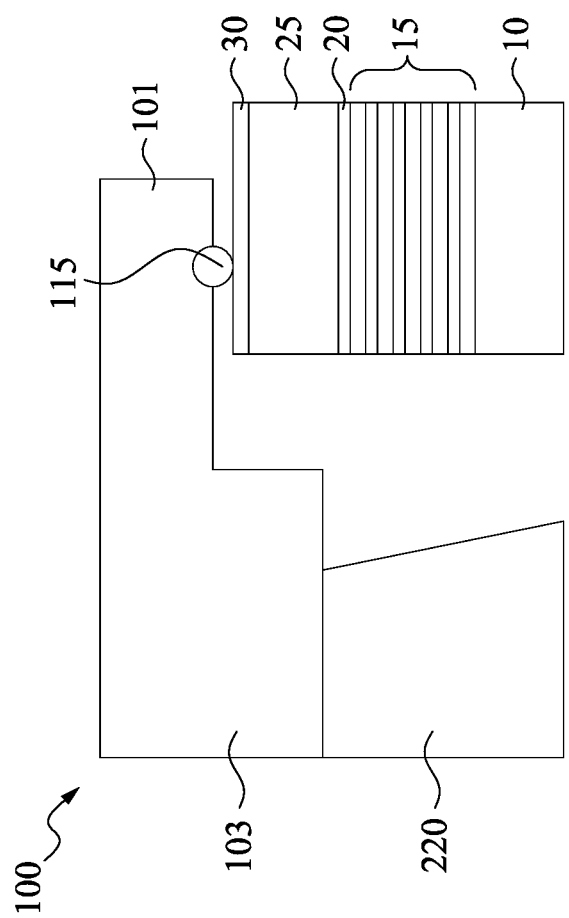

FIG. 4C shows another embodiment of the etching hard cover 100 according to the present disclosure. In this embodiment, instead of a protrusion 105 shown in FIG. 4A, an O-ring 115 embedded in a groove formed on the lower surface of the main cover portion 101 is used to be in contact with the upper surface of the EUV photo mask 5. The O-ring 115 is made of an elastic material, for example, but not limited to, rubber (e.g., butadiene rubber, butyl rubber, ethylene propylene diene monomer rubber, or nitrile rubber), polytetrafluoroethylene (PTFE), perfluoroelastomer, or silicone. Similar to the line shaped protrusion 105, the use of the O-ring 115 can minimize the contact area of the etching hard cover 100 to the surface of the EUV photo mask 5. The diameter of the O-ring is in a range from about 1 mm to 5 mm in some embodiments.

Figure 4D:
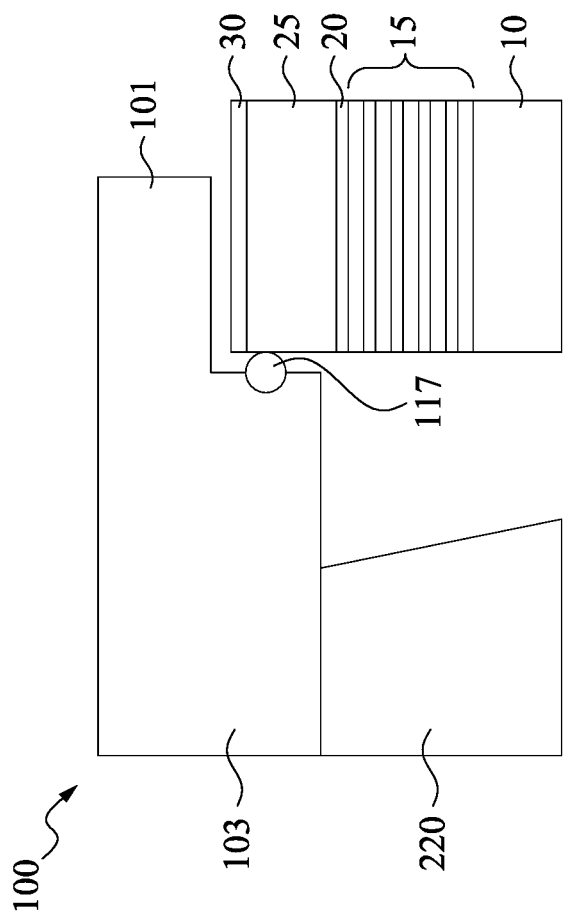

FIG. 4D shows another embodiment of the etching hard cover 100 according to the present disclosure. In this embodiment, instead of a protrusion 107 shown in FIG. 4B, an O-ring 117 embedded in a groove formed on the lower surface of the main cover portion 101 is used to be in contact with the upper surface of the EUV photo mask 5. The O-ring 117 is made of an elastic material, for example, but not limited to, rubber (e.g., butadiene rubber, butyl rubber, ethylene propylene diene monomer rubber, or nitrile rubber), polytetrafluoroethylene (PTFE), perfluoroelastomer, or silicone. Similar to the line shaped protrusion 105, the use of the O-ring 117 can minimize the contact area of the etching hard cover 100 to the surface of the EUV photo mask 5. The diameter of the O-ring is in a range from about 1 mm to 5 mm in some embodiments.

In some embodiments, both the O-ring 115 and the O-ring 117 are provided to the etching hard cover 100. In some embodiments, one of the protrusions 105 and 107 and one of the O-rings 115 and 117 are combined.

Figure 4F:
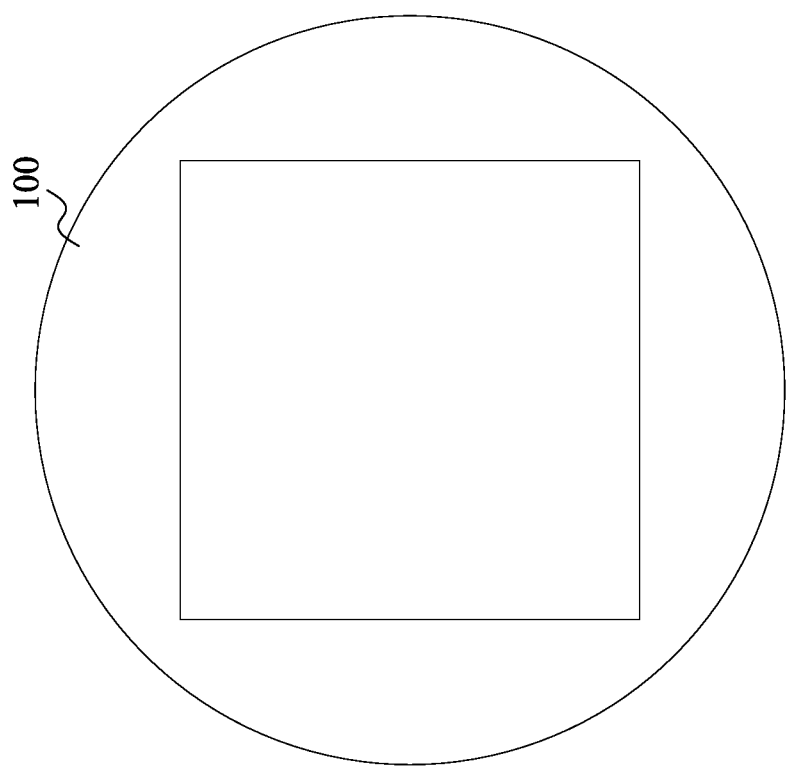
FIGS. 4E and 4F show structures of hard etching covers according to embodiments of the present disclosure.
Figure 4E:
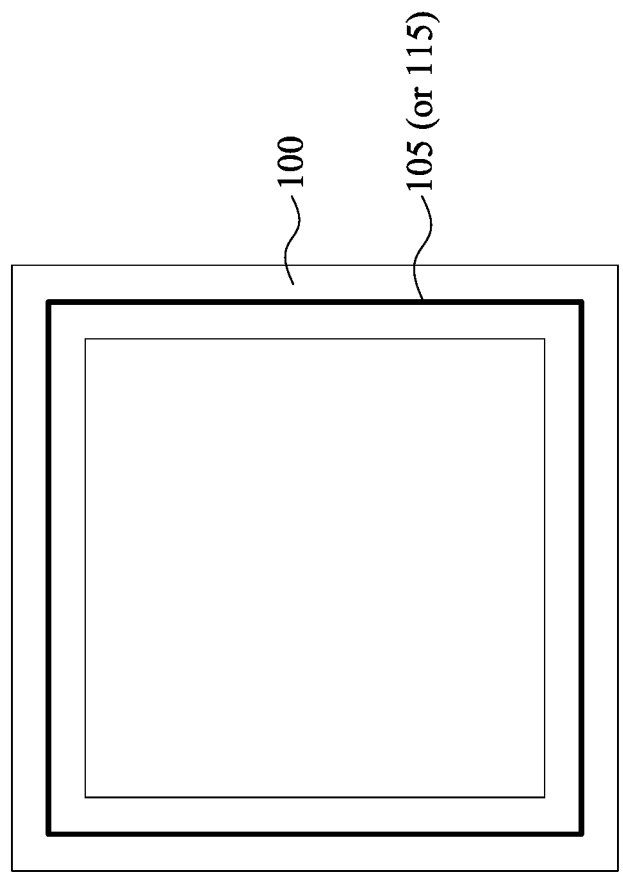

FIG. 4E shows a line-shape protrusion 105 or a line-shaped O-ring 115 according to embodiments of the present disclosure. In some embodiments, the shape of the outer peripheral of the etching hard cover 100 is oval or circular, while the shape of the inner peripheral of the opening is square or rectangular as shown in FIG. 4F.

Figure 5:
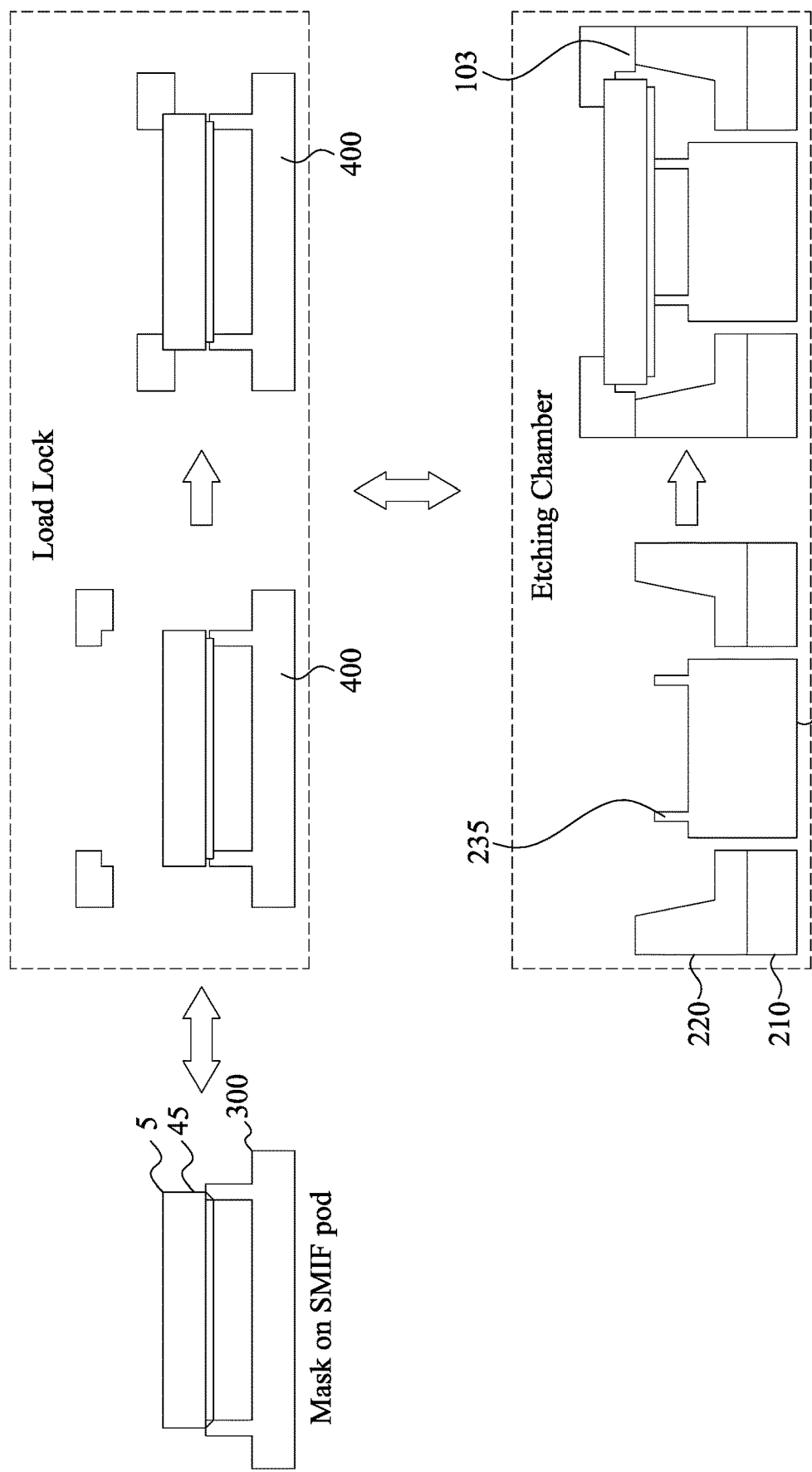
FIG. 5 shows operations of loading an EUV photo mask to be etched into an etching chamber through a load lock chamber.

FIG. 5 shows operations of loading an EUV photo mask to be etched into an etching chamber through a load lock chamber. In some embodiments, an EUV photo mask 5 to be subjected to a plasma etching is stored in a SMIF (Standard Mechanical Interface) pod and carried by the SMIF pod to an etching apparatus. The EUV photo mask 5 is transferred from the SMIF pod to a load lock chamber of the etching apparatus. In the load lock chamber, the EUV photo mask 5 is placed on a stage 400 in some embodiments. After the EUV photo mask 5 is placed on the stage 400, an etching hard cover 100 is placed on the EUV photo mask 5 from above, as shown in FIG. 5. After the etching hard cover 100 is placed on the EUV photo mask 5, the EUV photo mask 5 with the etching hard cover 100 is transferred from the load lock chamber to an etching chamber, as shown in FIG. 5. In the etching chamber, the EUV photo mask 5 is placed on burls 235 of a cathode 230 of an electric chuck. When the EUV photo mask 5 is moved down from above to the burls 235, a capture ring 220 of the stage 200 comes in contact with the bottom of the side frame 103 of the etching hard cover 100 just before the backside conductive layer 45 comes in contact with the burls 235, or at the same time as the backside conductive layer 45 comes in contact with the burls 235.

After the etching operation is completed, the EUV photo mask 5 with the etching hard cover 100 is transferred from the etching chamber to the load lock chamber. The etching hard cover 100 is detached from the EUV photo mask 5 in the load lock chamber, and the EUV photo mask 5 is unloaded from the load lock chamber to the SMIF pod to the next operation, such as cleaning.

In other embodiments, the etching hard cover 100 is placed over the EUV photo mask 5 in the etching chamber. In some embodiments, a cover supporter which can move the etching hard cover 100 up and down is disposed inside the etching chamber prior to or after a plasma etching operation.

Figure 9A:
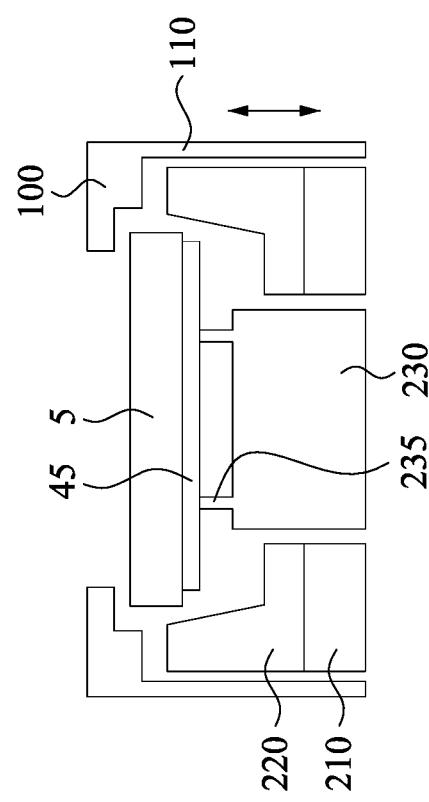
FIGS. 9A, 9B and 9C show view of various cover supports according to embodiments of the present disclosure.
Figure 9B:
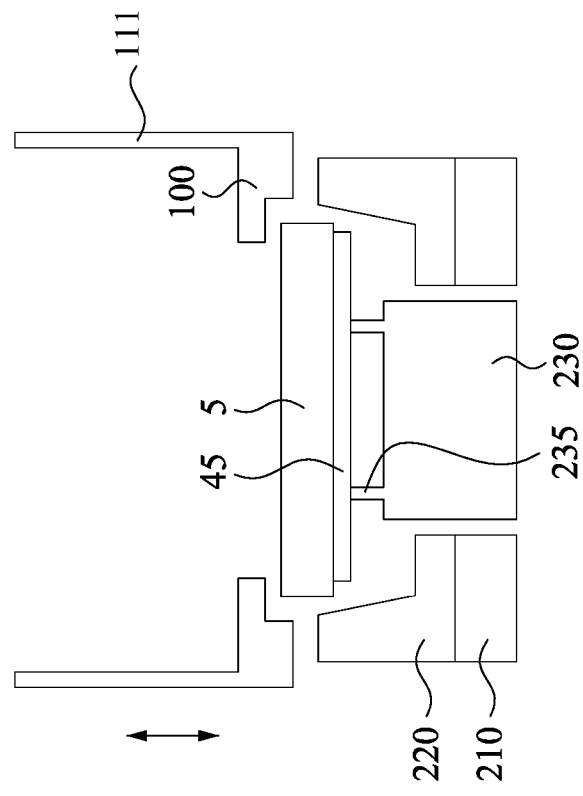
Figure 9C:
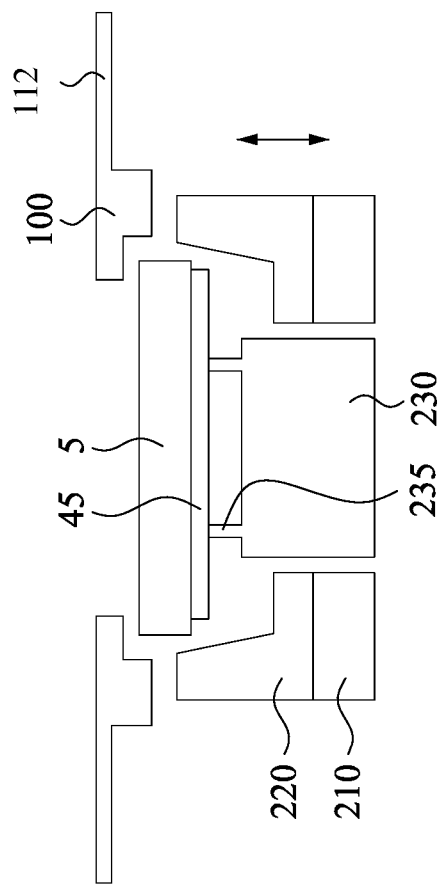

FIGS. 9A-9C show view of carious cover support 110 according to embodiments of the present disclosure. In FIG. 9A, one or more support posts 110 are attached to the bottom of the etching hard cover 100. The support posts 110 are coupled to a moving mechanism to move the support posts 110 vertically relative to the capture ring 220. In FIG. 9B, one or more support posts 111 are attached to the upper surface of the etching hard cover 100. The support posts 111 are coupled to a moving mechanism to move the support posts 110 vertically relative to the capture ring 220. Further, in FIG. 9C, one or more support posts 112 laterally extend from the etching hard cover 100. The support posts 110 are coupled to a moving mechanism to move the support posts 110 vertically relative to the capture ring 220.

In the foregoing embodiments, the etching hard cover 100 is used in an etching operation to etch the absorber layer 25 by using the hard mask layer 30 as an etching mask. The etching hard cover 100 can also be used in an etching of the hard mask layer 30 by using the first photo resist layer 35 as an etching mask, as shown in FIG. 1B. In such a case, the bottom of the main cover portion 101 of the etching hard cover 100 (or the protrusion 105 or the O-ring 115) may be in contact with the first photo resist layer 35.

The etching hard cover 100 can also be used in an etching of the absorber layer 25, the capping layer 20, and the multilayer Mo/Si stack 15 by using the second photo resist layer 45 as an etching mask, as shown in FIG. 1F. In such a case, the bottom of the main cover portion 101 of the etching hard cover 100 (or the protrusion 105 or the O-ring 115) may be in contact with the second photo resist layer 45.

Figure 6:
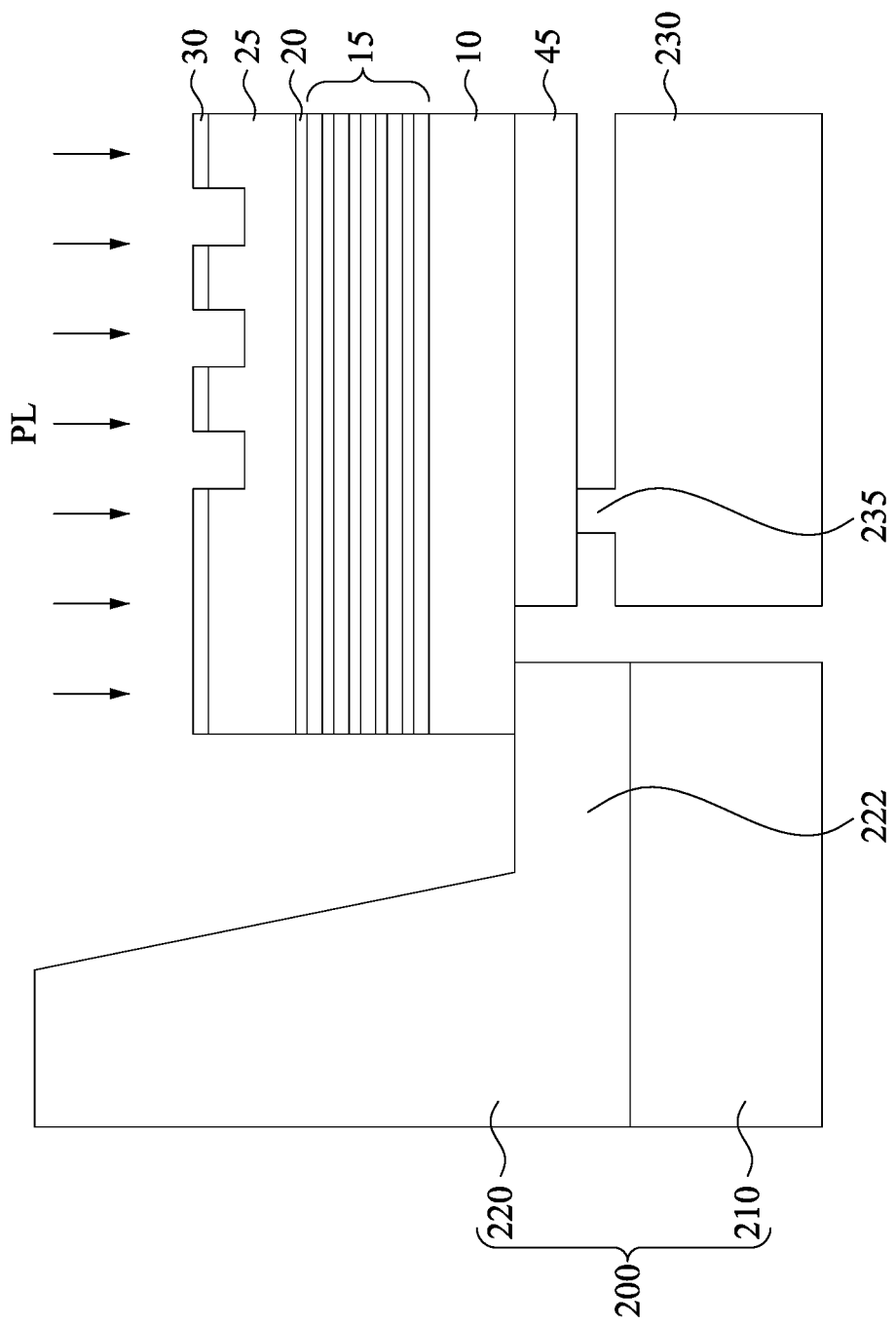
FIG. 6 shows a schematic view of an etching operation of an EUV photo mask according to one embodiment of the present disclosure.

FIG. 6 shows a schematic view of an etching operation of an EUV photo mask according to one embodiment of the present disclosure, to prevent the active species of the plasma from entering the bottom portion of the EUV photo mask during plasma etching.

In some embodiments, the stage 200 of the etching apparatus is configured such that when an EUV photo mask 5 is placed on the burls 235 of the cathode 230 of the electric chuck, the bottom surface of the substrate 10 is in contact with a flat portion 222 of the capture ring 220, as shown in FIG. 6. In some embodiments, a difference D1 in height between the flat portion 222 and the burl 235 is substantially equal to the thickness of the backside conductive layer 45 and is in a range from about 10 nm to about 100 nm. In some embodiments, there is a small gap between the bottom surface of the substrate 10 and the flat portion 222. In certain embodiments, the gap is in a range from about 0 mm to about 0.1 mm.

According to this configuration, it is possible to prevent active species of plasma PL from entering the back portion of the EUV photo mask 5 during the plasma etching. Thus, it is possible to prevent damage on the backside conductive layer 45. In this configuration, an etching hard mask cover 100 may or may not be used.

Figure 7:
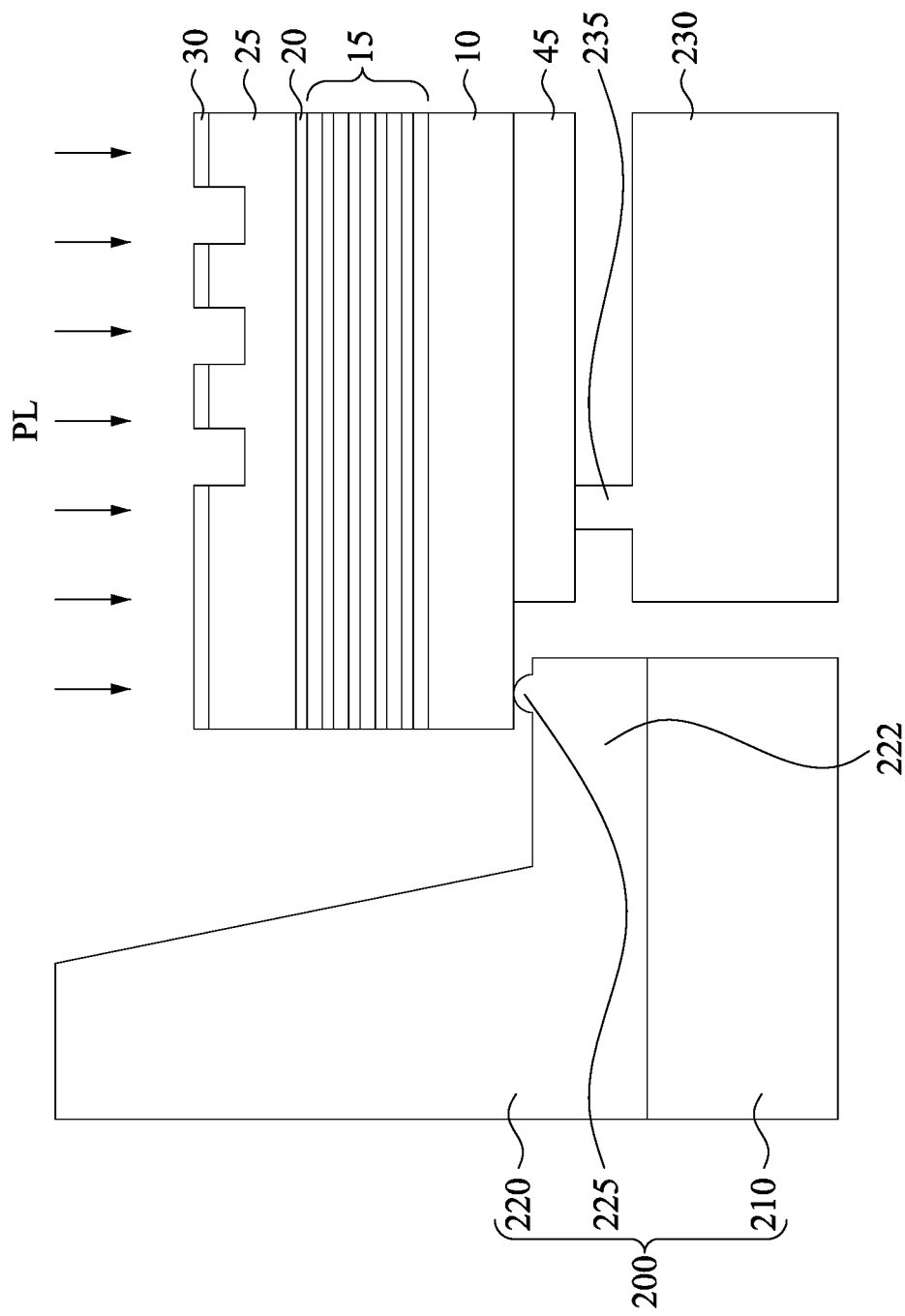
FIG. 7 shows a schematic view of an etching operation of an EUV photo mask according to another embodiment of the present disclosure.

FIG. 7 shows a schematic view of an etching operation of an EUV photo mask according to one embodiment of the present disclosure, to prevent the active species of the plasma from entering the bottom portion of the EUV photo mask during plasma etching.

In some embodiments, the flat portion 225 of the capture ring 220 of the stage 200 has a protrusion 225, such that when an EUV photo mask 5 is placed on the burls 235 of the cathode 230 of the electric chuck, the bottom surface of the substrate 10 is in contact with the protrusion 225 of the capture ring 220, as shown in FIG. 7. In some embodiments, there is a small gap between the bottom surface of the substrate 10 and the protrusion 225. In certain embodiments, the gap is in a range from about 0 mm to about 0.1 mm.

The protrusion 225 is a line shape pattern and formed along the entire circumference of the flat portion 222 in some embodiments. In other embodiments, multiple protrusions 225 are discretely provided along the circumference of the flat portion 222. A protruding amount of the protrusion 225 is in a range from about 0.1 mm to about 1.0 mm in some embodiments. When the protrusion 225 is used, it is possible to minimize the contact area of the flat portion 222 of the capture ring 220 to the bottom surface of the substrate 10 of the EUV photo mask 5 when the substrate 10 of the EUV photo mask 5 is in contact with the flat portion 222. In other embodiments, there is a gap between the protrusion 225 and the bottom surface of the substrate 10 of the EUV photo mask 5. In certain embodiments, the gap is in a range from about 0 mm to about 0.1 mm. By using the protrusion 225 on the flat portion 222 of the stage 200, it is possible to prevent active species of plasma PL from entering the back portion of the EUV photo mask 5 during the plasma etching. Thus, it is possible to prevent damage on the backside conductive layer 45. In this configuration, an etching hard mask cover 100 may or may not be used.

Figure 8:
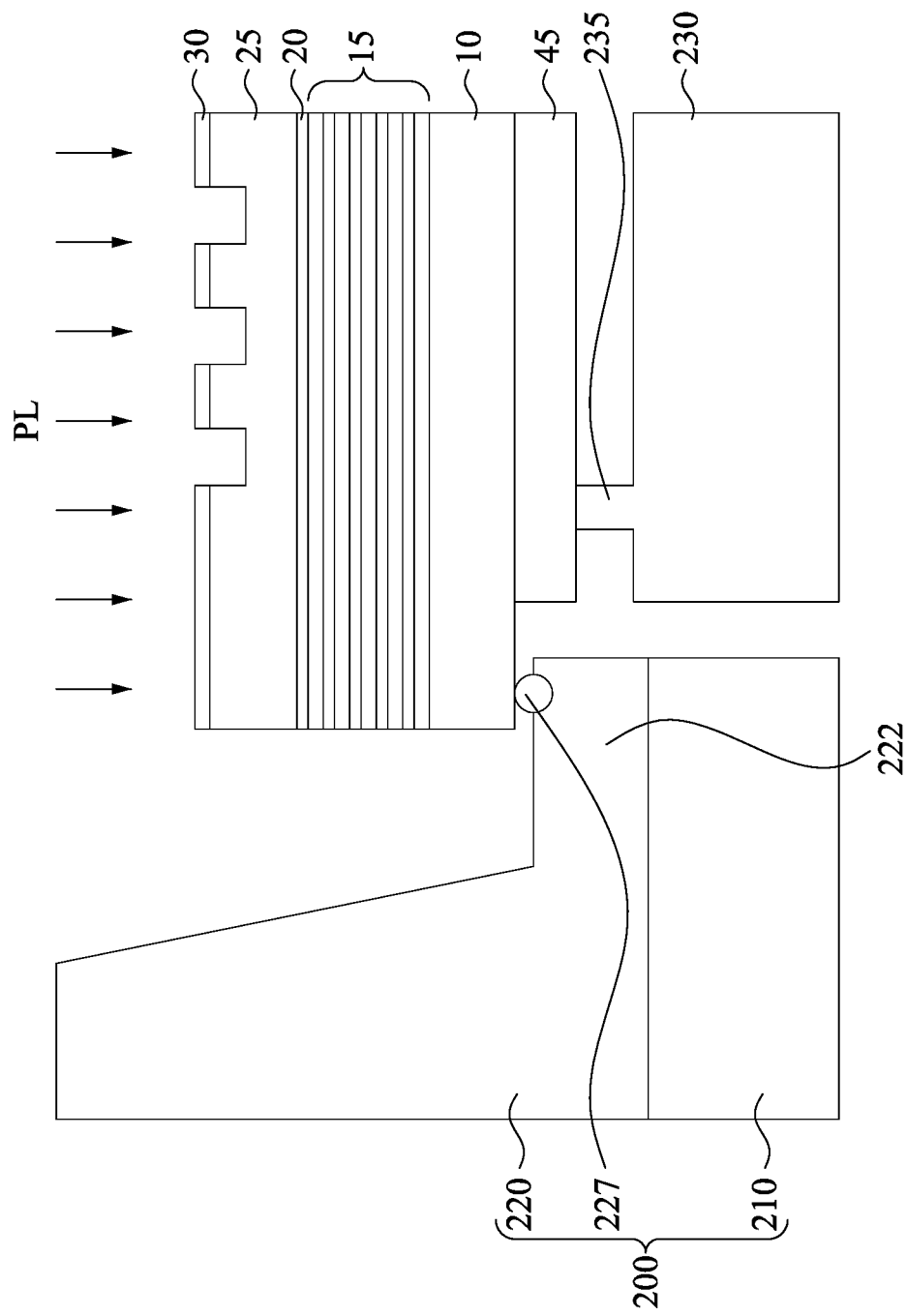
FIG. 8 shows a schematic view of an etching operation of an EUV photo mask according to another embodiment of the present disclosure.

FIG. 8 shows a schematic view of an etching operation of an EUV photo mask according to one embodiment of the present disclosure, to prevent the active species of the plasma from entering the bottom portion of the EUV photo mask during plasma etching.

In this embodiment, instead of a protrusion 225 shown in FIG. 7, an O-ring 227 embedded in a groove formed on the flat portion 222 of the capture ring 220 of the stage 200 is used to be in contact with the bottom surface of the substrate 10 of the EUV photo mask 5. The O-ring 227 is made of an elastic material, for example, but not limited to, rubber (e.g., butadiene rubber, butyl rubber, ethylene propylene diene monomer rubber, or nitrile rubber), polytetrafluoroethylene (PTFE), perfluoroelastomer, or silicone. Similar to the line shaped protrusion 225, the use of the O-ring 227 can minimize the contact area of the flat portion 222 of the stage 200 to the bottom surface of the substrate 10 of the EUV photo mask 5. The diameter of the O-ring is in a range from about 1 mm to 5 mm in some embodiments. By using the O-ring 227 on the flat portion 222 of the stage 200, it is possible to prevent active species of plasma PL from entering the back portion of the EUV photo mask 5 during the plasma etching. Thus, it is possible to prevent damage on the backside conductive layer 45. In this configuration, an etching hard mask cover 100 may or may not be used.

It will be understood that not all advantages have been necessarily discussed herein, no particular advantage is required for all embodiments or examples, and other embodiments or examples may offer different advantages.

For example, by using a detachable etching hard cover in the etching operation for an EUV photo mask 5 having a backside conductive layer to cover the edge portion of the EUV photo mask, it is possible to prevent active species of plasma from entering the side portions and the back portion of the EUV photo mask during the plasma etching. Thus, it is possible to prevent damage on the backside conductive layer 45 and to prevent generation of particles or unsecure chucking to the electric substrate chucking mechanism. Further, by contacting the bottom surface of the substrate to the flat portion of the capture ring of the stage 200, it is possible to prevent active species of plasma from entering the back portion of the EUV photo mask during the plasma etching. Thus, it is possible to prevent damage on the backside conductive layer 45 and to prevent generation of particles or unsecure chucking to the electric substrate chucking mechanism.

In accordance with one aspect of the present disclosure, in a method of manufacturing a photo mask, an etching mask layer having circuit patterns is formed over a target layer of the photo mask to be etched. The photo mask includes a backside conductive layer. The target layer is etched by plasma etching, while preventing active species of plasma from attacking the backside conductive layer. In one or more of the foregoing and following embodiment, an edge portion of the target layer is covered with an etching hard cover, while a region of the target layer to be etched is exposed through an opening of the etching hard cover. In one or more of the foregoing and following embodiment, the etching hard cover is reusable. In one or more of the foregoing and following embodiment, the etching hard cover is made of ceramic. In one or more of the foregoing and following embodiment, the etching hard cover has a frame shape having the opening and a frame portion defining the opening and a side frame from which the frame portion extends. In one or more of the foregoing and following embodiment, the frame portion covers the edge portion. In one or more of the foregoing and following embodiment, a bottom surface of the frame portion is in contact with the etching mask layer. In one or more of the foregoing and following embodiment, a bottom surface of the frame portion is not in contact with the etching mask layer with a gap. In one or more of the foregoing and following embodiment, the gap is equal to or less than 1 mm. In one or more of the foregoing and following embodiment, a bottom surface of the frame portion includes a protrusion. In one or more of the foregoing and following embodiment, the protrusion is a line shape. In one or more of the foregoing and following embodiment, the protrusion is in contact with the etching mask layer. In one or more of the foregoing and following embodiment, the side frame includes a protrusion. In one or more of the foregoing and following embodiment, the protrusion is a line shape. In one or more of the foregoing and following embodiment, the protrusion is in contact with side surfaces of the photo mask. In one or more of the foregoing and following embodiment, a bottom surface of the frame portion includes a groove in which an O-ring is disposed. In one or more of the foregoing and following embodiment, the O-ring is in contact with the etching mask layer. In one or more of the foregoing and following embodiment, the side frame includes a groove in which an O-ring is disposed. In one or more of the foregoing and following embodiment, the O-ring is in contact with side surfaces of the photo mask. In one or more of the foregoing and following embodiment, the photo mask is placed on a stage such that a bottom surface of the photo mask where no backside conductive layer is disposed is in contact with the stage. In one or more of the foregoing and following embodiment, the backside conductive layer is in contact with an electric chuck and is not in contact with the stage. In one or more of the foregoing and following embodiment, the stage includes a protrusion in contact with the bottom surface of the photo mask. In one or more of the foregoing and following embodiment, the stage includes a groove in which an O-ring in contact with the bottom surface of the photo mask is disposed. In one or more of the foregoing and following embodiment, the photo mask is placed on a stage such that a bottom surface of the photo mask where no backside conductive layer is disposed is placed above the stage with a gap equal to or less than 0.5 mm.

In accordance with another aspect of the present disclosure, an etching hard cover for an EUV photo mask manufacturing operation is made of ceramic. The etching hard cover has a frame shape having an opening and a frame portion defining the opening and a side frame from which the frame portion extends, and at least one of a bottom surface of the frame portion and the side frame includes an abutting portion configured to abut the photo mask, when the etching hard cover is placed over the photo mask. In one or more of the foregoing and following embodiment, the bottom surface of the frame portion includes a protrusion as the abutting portion. In one or more of the foregoing and following embodiment, the protrusion is a line shape. In one or more of the foregoing and following embodiment, the side frame includes a protrusion as the abutting portion. In one or more of the foregoing and following embodiment, the protrusion is a line shape. In one or more of the foregoing and following embodiment, the bottom surface of the frame portion includes a groove in which an O-ring is disposed. In one or more of the foregoing and following embodiment, the side frame includes a groove in which an O-ring is disposed.

In accordance with another aspect of the present disclosure, an etching apparatus for etching a target layer of a photo mask includes a mask stage and an electric chuck to hold the photo mask. The mask stage includes a protrusion at a flat surface of the mask stage to be in contact with a bottom surface of the photo mask. In accordance with another aspect of the present disclosure, an etching apparatus for etching a target layer of a photo mask includes a mask stage and an electric chuck to hold the photo mask. The mask cover includes a groove in which an O-ring to be in contact with a bottom surface of the photo mask is disposed.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a photo mask, the method comprising:
   forming an etching mask layer having patterns over a target layer of the photo mask to be etched;
   covering an edge portion of the photo mask with a frame shaped etching hard cover having an opening; and
   etching the target layer by plasma etching through the opening.

2. The method of claim 1, wherein during the etching comprises preventing active species of plasma from attacking a backside of the photo mask.

3. The method of claim 1, wherein the frame shaped cover layer is distanced from the etching mask layer.

4. The method of claim 1, wherein the frame shaped cover layer is in contact with the etching mask layer.

5. The method of claim 1, wherein the frame shaped cover layer is in contact with the target layer to be etched.

6. The method of claim 1, wherein:
   the etching mask layer is a resist pattern, and
   the target layer is a hard mask layer on an absorber layer of the photo mask.

7. The method of claim 1, wherein:
   the etching mask pattern is a hard mask pattern, and
   the target layer is an absorber layer of the photo mask.

8. The method of claim 1, wherein:
   the etching mask layer is a resist pattern, and
   the target layer includes an absorber layer, a capping layer and a reflective multilayer disposed over a substrate of the photo mask.

9. A method of manufacturing a photo mask, comprising:
   forming a circuit pattern in an absorber layer of a mask blank, the mask blank including a substrate, a reflective multilayer on the substrate, a capping layer on the reflective multilayer and an absorber layer;
   forming an etching mask layer having a black border pattern over the absorber layer;
   covering an edge portion of the absorber layer with an etching hard cover having an opening, the opening having a rectangular shape; and
   etching the absorber layer, the capping layer and the reflective multilayer by plasma etching through the opening, while preventing active species of plasma from attacking a backside of the mask blank.

10. The method of claim 9, wherein the cover layer is separated from the etching mask layer.

11. The method of claim 9, wherein the cover layer is in contact with the etching mask layer.

12. The method of claim 9, wherein the etching hard cover is made of ceramic.

13. The method of claim 12, wherein the etching hard cover has a frame shape having the opening and a frame portion defining the opening and a side frame from which the frame portion extends.

14. An etching apparatus for patterning a reflective photo mask, comprising:
 a mask stage; and
 an electric chuck to hold the reflective photo mask, wherein:
 the electric chuck including a cathode and the mask stage includes a capture ring surrounding the electric chuck, and
 a cathode protrusion is provided on the cathode.

15. The etching apparatus of claim 14, wherein a stage protrusion is provided at a flat surface of the capture ring of the mask stage.

16. The etching apparatus of claim 14, wherein the stage protrusion is an O-ring disposed in a groove formed in the capture ring.

17. The etching apparatus of claim 14, wherein the stage protrusion is a protruding part of the capturing ring.

18. The etching apparatus of claim 14, wherein the electric chuck is configured to move up and down relative to the capture ring.

19. The etching apparatus of claim 14, wherein the stage protrusion is configured to contact a part of a substrate of the reflective photo mask where no conductive layer is formed.

20. The etching apparatus of claim 14, wherein the capture ring is configured such that when the reflective photo mask is placed on the mask stage, a top of the capture ring is located above a top of the reflective photo mask.

* * * * *